(12) United States Patent
Chiu

(10) Patent No.: US 6,277,692 B1
(45) Date of Patent: Aug. 21, 2001

(54) PROCESS FOR FABRICATING AN EEPROM

(75) Inventor: Te-Long Chiu, San Jose, CA (US)

(73) Assignee: Turbo IC, San Jose, CA (US)

( * ) Notice: Subject to any disclaimer, the term of this patent is extended or adjusted under 35 U.S.C. 154(b) by 0 days.

(21) Appl. No.: 09/184,929

(22) Filed: Nov. 2, 1998

Related U.S. Application Data

(60) Provisional application No. 60/085,707, filed on May 15, 1998.

(51) Int. Cl.⁷ ...................... H01L 21/336; H01L 21/8247
(52) U.S. Cl. ............................................. 438/264; 438/265
(58) Field of Search ................................... 438/264, 265, 438/FOR 203, 594; 257/321

(56) References Cited

U.S. PATENT DOCUMENTS

| | | |
|---|---|---|
| 4,115,915 | 9/1978 | Harari ..................... 29/571 |
| 4,203,158 | 5/1980 | Bentchkowsky et al. ........... 365/185 |
| 5,021,848 | 6/1991 | Chiu ..................... 357/23.5 |
| 5,470,773 | * 11/1995 | Liu et al. . |
| 5,840,607 | * 11/1998 | Yeh et al. . |

* cited by examiner

Primary Examiner—George Fourson
Assistant Examiner—Michelle Estrada
(74) Attorney, Agent, or Firm—Pillsbury Winthrop LLP; David H. Jaffer

(57) ABSTRACT

A method of protecting a tunnel dielectric area from subsequent processing steps in EEPROM fabrication after formation of a memory cell poly 1 floating gate on a P-type substrate, including first implanting the substrate to form a buried N+ junction below and beside the floating gate, and then growing a first thin oxide layer over the N+ junction and on sidewalls of the floating gate and a selection device gate. A thin layer of polysilicon is deposited and then a second thin oxide layer is grown over the thin polysilicon layer. A photoresist is applied, and then removed from the top surface and the sidewalls of the gate structures. The second thin oxide layer is removed from the top surface and the vertical sidewalls of the gate structures. The photoresist is removed, and the thin polysilicon layer and the first thin oxide layer is removed from the sidewalls of the poly 1 floating gate structure, and the polysilicon layer and the second thin oxide layer are removed from the horizontal surfaces except for the area immediately above the tunnel dielectric area and at the base of the sidewalls. With the tunnel dielectric area thus protected, an add-on polysilicon layer is deposited and etched back to form an add-on floating gate at the sidewalls of the floating gate of the memory cell, and the add-on gate to the selection device.

12 Claims, 10 Drawing Sheets

Cross section A-A

Cross section B-B

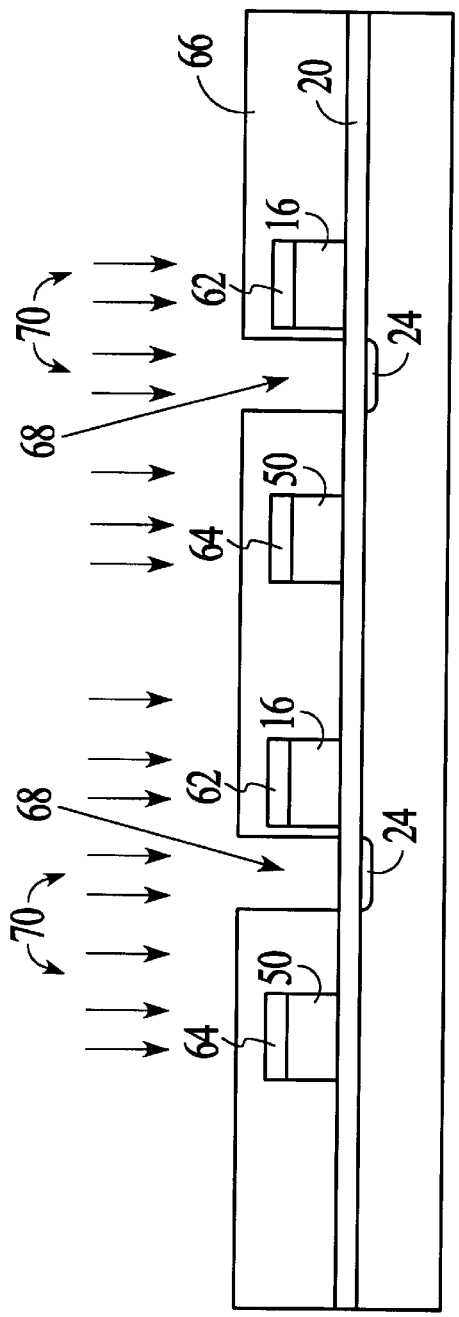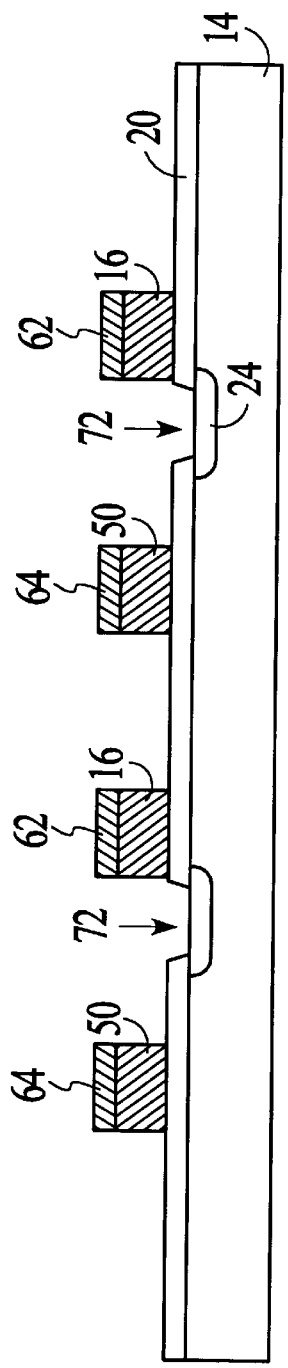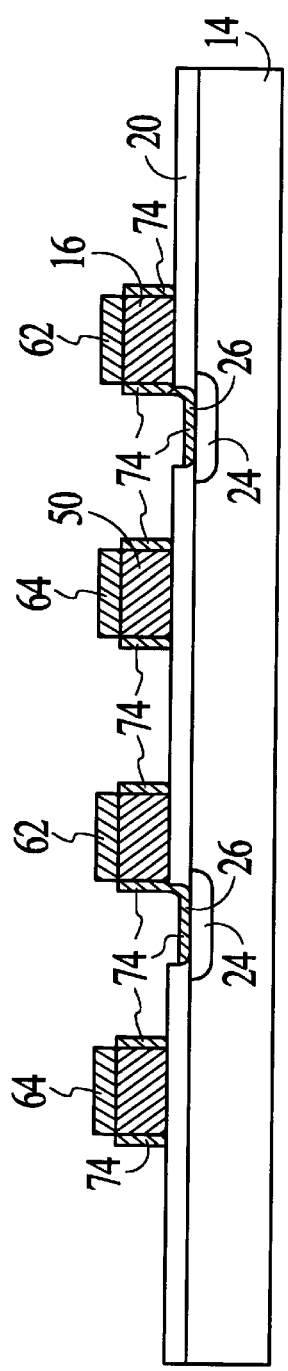

PROCESS FOR FABRICATING AN EEPROM

This application claims the benefit of U.S. Provisional Application Serial No. 60/085,707, filed May 15, 1998.

FIELD OF THE INVENTION

The present invention relates generally to EEPROM devices, and more particularly to an improved process for fabricating an EEPROM that protects a sensitive tunnel dielectric area from contamination resulting from subsequent processing steps.

BRIEF DESCRIPTION OF THE PRIOR ART

An electrically erasable and electrically programmable memory cell EEPROM is disclosed in U.S. Pat. No. 4,115,915 by Harari, and in U.S. Pat. No. 4,203,158 by Frohman-Bentchkowsky et al. An improved EEPROM is disclosed in U.S. Pat. No. 5,021,848 by Chiu, wherein the EEPROM tunnel dielectric area has the benefit of being very small and self aligned with the floating gate.

EEPROM devices are now being produced in high volume. The cost of EEPROMs is influenced by production yields and related inspection processes, as well as other production cost parameters. In semiconductor processing, the reduction of contamination of material is always an important issue. Environmental contaminants during process steps, and the influence of subsequent processes on earlier processing results is a concern in need of constant attention.

There is, therefore, a need for improved processing methods that minimize the possibility of wafer contamination during the processing steps of manufacturing electrically-erasable and electrically programmable memory storage devices, i.e. EEPROMs.

SUMMARY OF THE INVENTION

It is therefore an object of the present invention to provide an improved method of manufacturing EEPROMs that reduces the possibility of wafer contamination.

It is a further object of the present invention to provide a method of sealing the processed EEPROM tunnel dielectric area from contamination resulting from subsequent processing steps.

Briefly, a preferred embodiment of the present invention includes method steps in the fabrication of EEPROM memory cell and cell selection devices after formation of a poly 1 floating gate, including first implanting a P-type substrate with an N-type impurity to form a buried N+ junction, and then growing a first thin oxide layer over the buried N+ junction and on sidewalls of the memory cell poly 1 floating gate and a selection device gate. The method steps of the preferred embodiment are for protection of the first thin oxide layer including a tunnel dielectric while forming an add-on Poly Si gate horizontally adjacent to the selection device gate, and an add-on gate adjacent the poly 1 floating gate and vertically above the buried N+ junction, the junction separated from the poly 1 floating gate by the first thin oxide layer at the base of the poly 1 floating gate. The method continues by depositing a thin layer of polysilicon and then growing a second thin oxide layer over the thin polysilicon layer. A photoresist is applied, and then removed from the top surface and the sidewalls of the poly 1 floating gate structures. With the photoresist protecting the second thin oxide layer, and the thin layer of polysilicon protecting the tunnel dielectric portion of the first thin oxide area over the buried N+ junction, the second thin oxide on the thin polysilicon layer is removed from the top surface and the vertical sidewalls of the poly 1 floating gate structures. The photoresist is removed, and the thin poly silicon layer is removed from the sidewalls and top of the poly 1 floating gate structure. Then, the second thin oxide on the thin poly silicon over the Buried N+ junction and the first thin oxide on the sidewalls of the poly 1 floating gate structures are removed. With the tunnel dielectric area thus protected, an add-on polysilicon layer is deposited and etched back to form the add-on floating gate at the sidewalls of the floating gate of the memory cell, and the add-on gate to the selection device.

An advantage of the present invention is that it provides protection of a tunnel dielectric area during formation of add-on gates.

A further advantage of the present invention is that it increases the production yield of EEPROM devices.

IN THE DRAWING

FIG. 3 illustrates the buried N+ mask resist and application of N-type ion implantation to form buried N+ junctions in the substrate;

FIG. 4 shows the resulting structure after stripping the buried N+ mask resist following the ion implantation illustrated in FIG. 3;

FIG. 5 shows the first thin oxide layer that is grown over the buried N+ junction areas and gate sidewalls;

Figure 14:
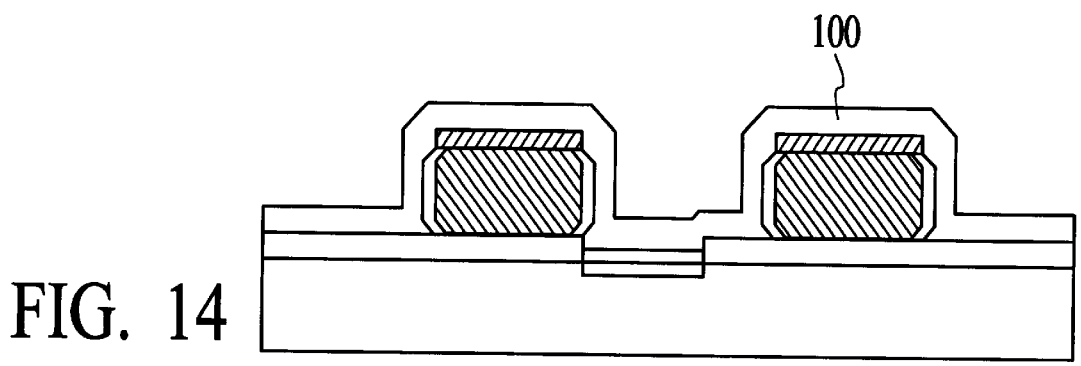
Figure 15:
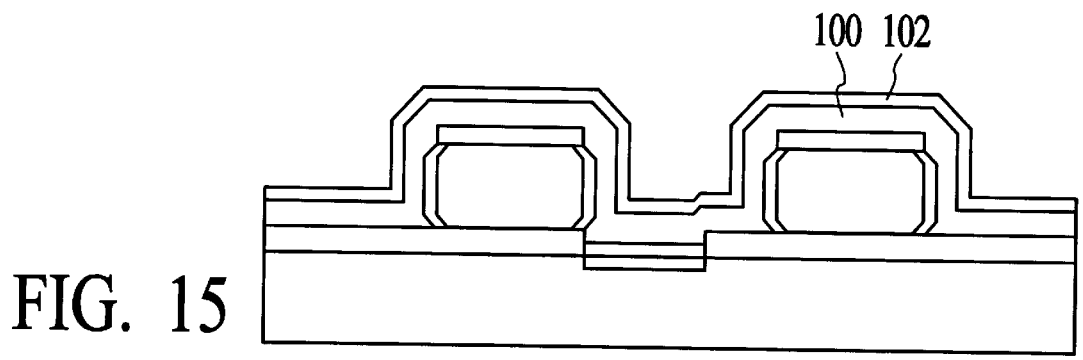
Figure 16:
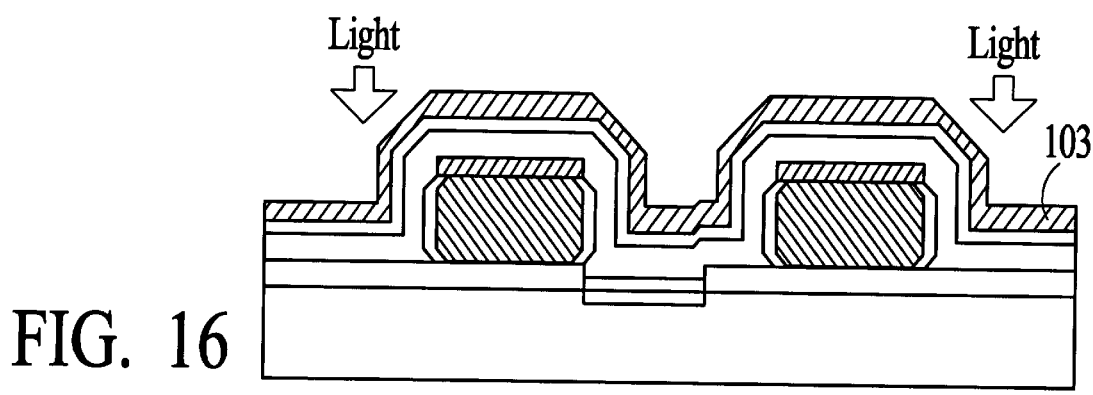
Figure 17:
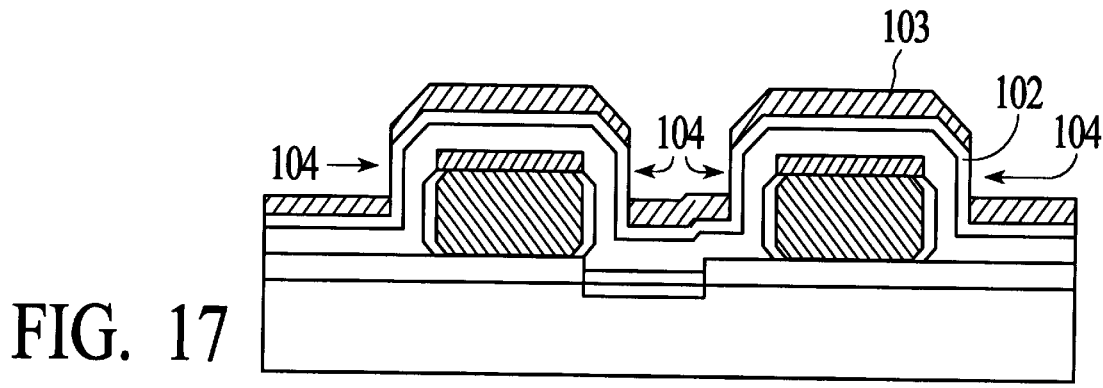
Figure 18:
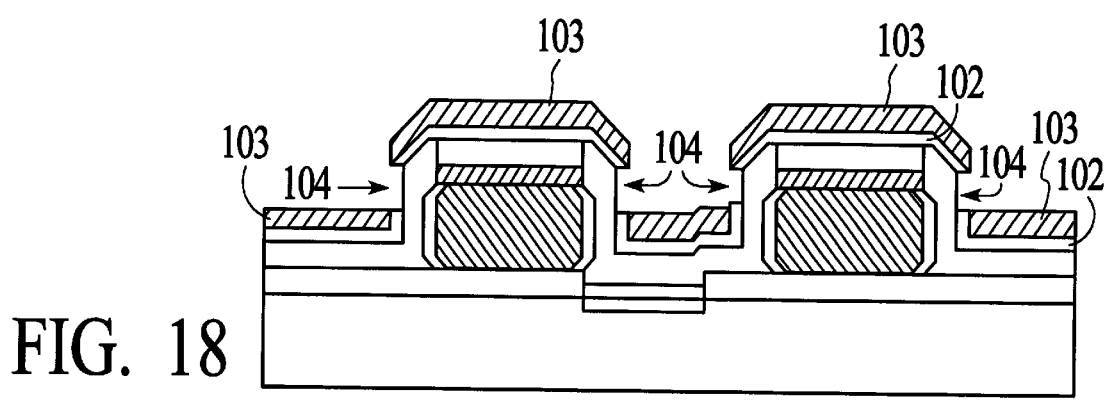
Figure 19:
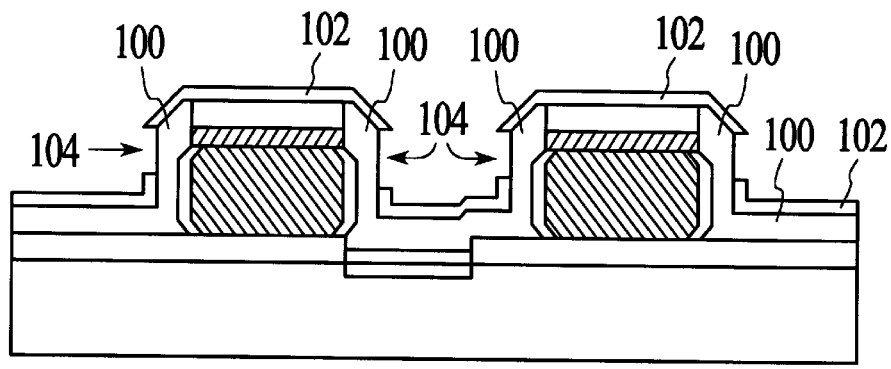
Figure 20:
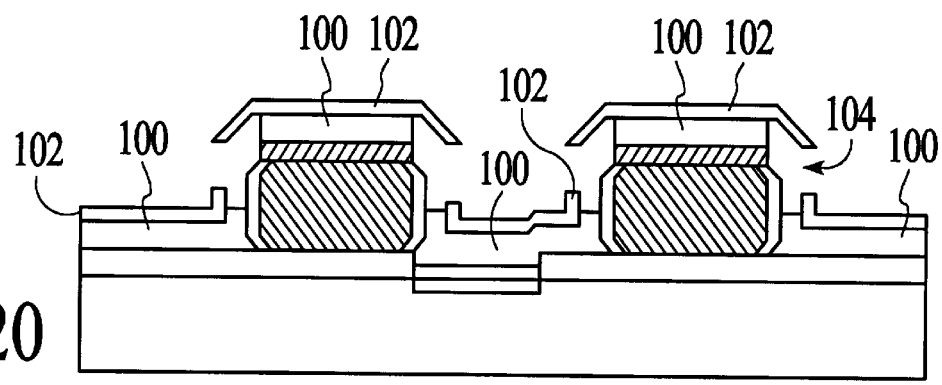
Figure 21:
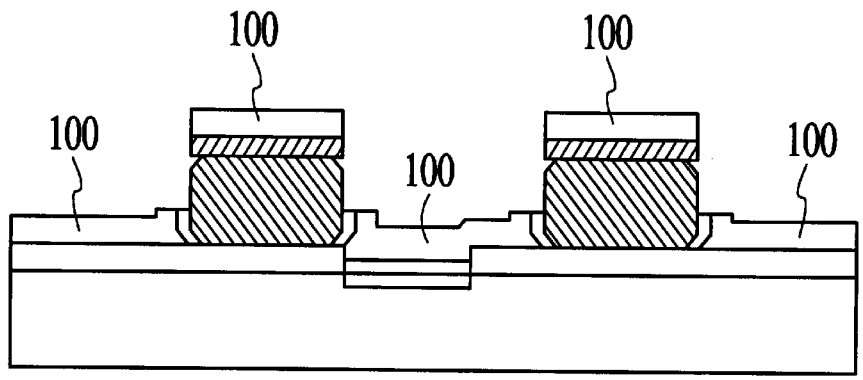
Figure 22:
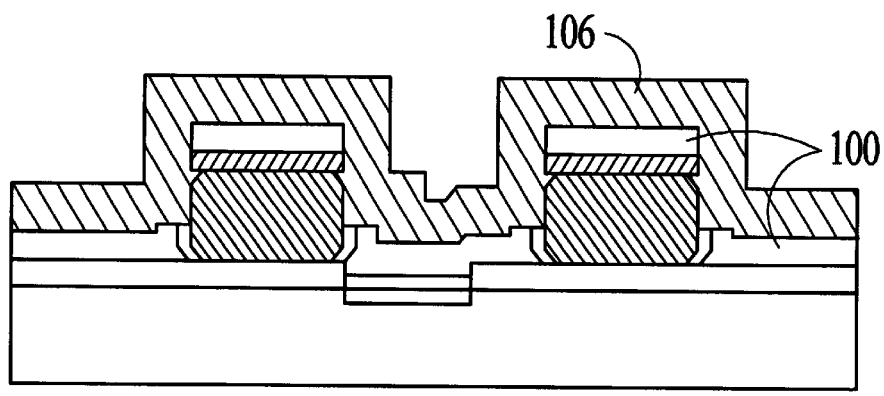
Figure 23:
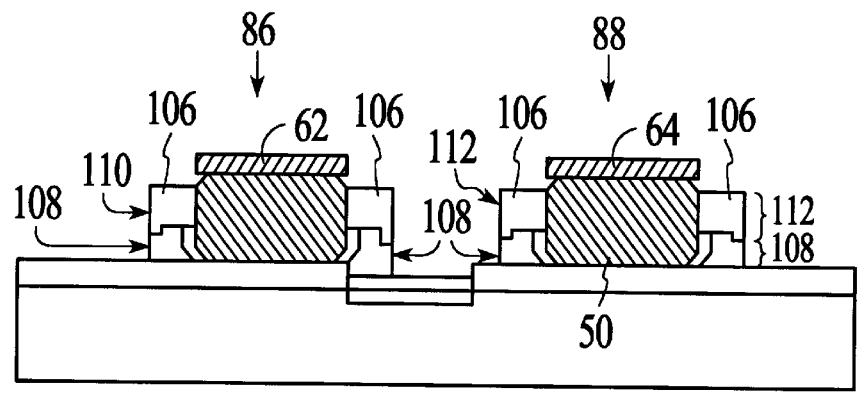
Figure 24:
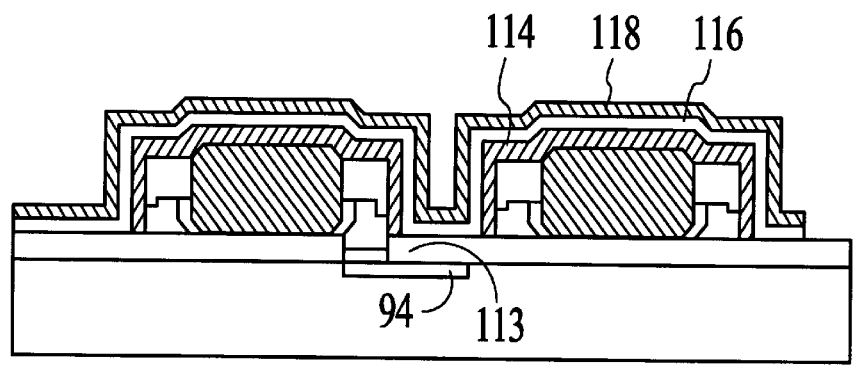
Figure 25:
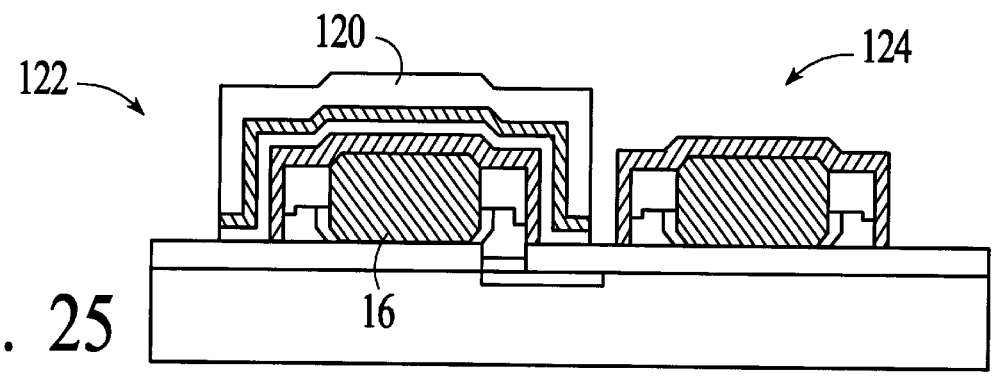

FIG. 14 displays the deposition of a thin polysilicon layer;

FIG. 15 illustrates the formation of a second thin oxide layer;

FIG. 16 illustrates the application and processing of a negative resist;

FIG. 17 shows the result of resist development, and resist etch-back;

FIG. 18 shows the second thin oxide etched back from the sidewalls of the poly 1 floating gate;

FIG. 19 shows the negative resist removed;

FIG. 20 shows exposed thin polysilicon at the sidewall of the poly 1 floating gate removed;

FIG. 21 shows the first thin oxide layer removed from the sidewall of the poly 1 floating gate, and the second thin oxide layer removed from the horizontal surfaces;

FIG. 22 illustrates the result of deposition and doping of a second polysilicon layer;

FIG. 23 shows the result of an anisotropic poly silicon etch forming add-on gates;

FIG. 24 illustrates a further step in completing the formation of a memory cell and selection device;

FIG. 25 illustrates another step in completing the formation of a memory cell and selection device;

DESCRIPTION OF THE PREFERRED EMBODIMENTS

Figure 1A:
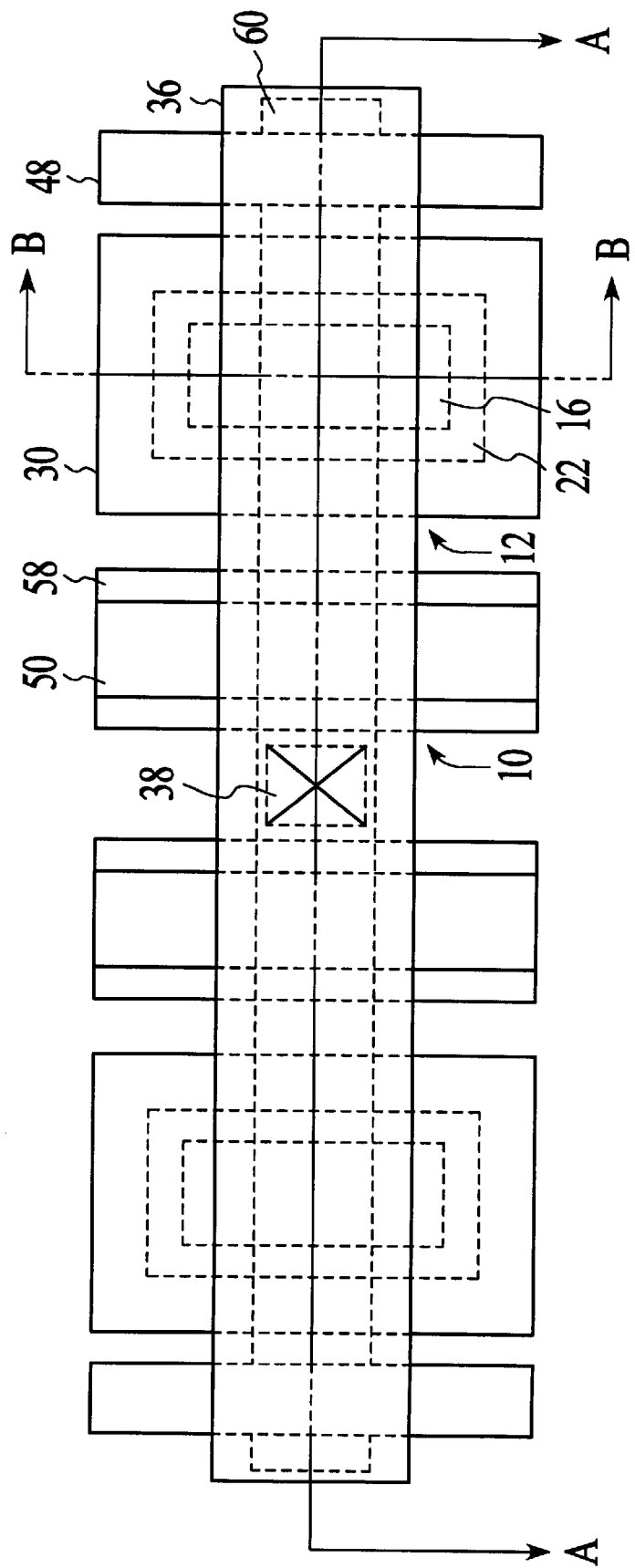
FIGS. 1A, 1B and 1C are top, side and end sectional view respectively of a mirror image pair of EEPROM memory and selection devices.
Figure 1B:
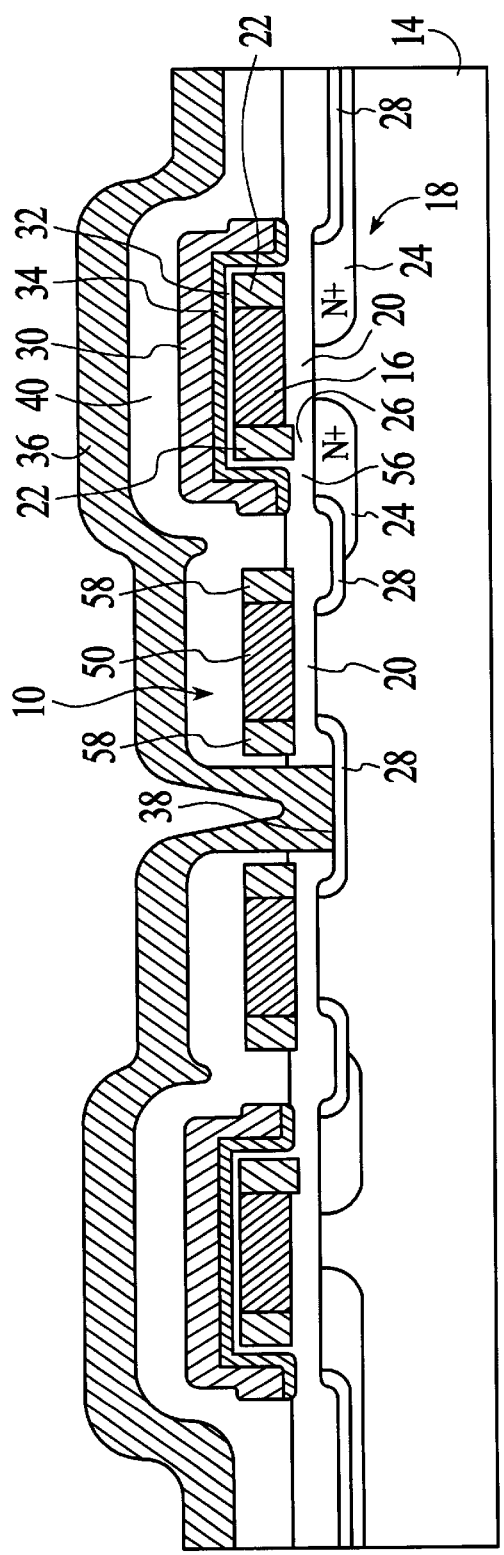
Figure 1C:
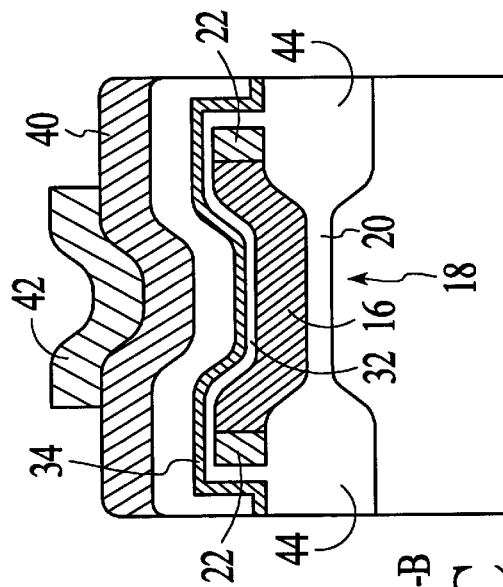

A preferred application of the method of the present invention is for manufacture of an EEPROM, generally illustrated in FIGS. 1A, 1B and 1C. The invention includes an improved method of fabrication, the novel steps of which will be fully described in the following text in reference to the figures of the drawing. The EEPROM is formed on a wafer having a plurality of memory cells, each as illustrated in FIGS. 1A, 1B and 1C, including a selection device 10 and a memory device 12 constructed on a wafer substrate 14, which will be described for example as a P-type monocrystalline silicon composition. Other substrate 14 compositions are also included in the spirit of the present invention. The memory device 12 includes a floating gate 16 disposed over a channel area 18, separated by a gate oxide layer 20. An add-on floating gate 22 is shorted electrically to the floating gate 16 and separated from a buried N+ junction 24 by a tunnel dielectric 26. The buried N+ junction serves as a buried drain of the EEPROM. A shallower junction 28 forms a source drain for peripheral transistors. A control gate 30 is formed over the floating gate 16 and add-on gate 22, and separated from them by interpoly dielectrics 32 and 34.

A metal line 36 connects the drains of all of the selection devices 10 of the EEPROM for a given row though a contact 38. A doped CVD oxide film 40 underneath the metal line 36 smoothes out sharp edges. Thick field oxide regions 44 serve to isolate adjacent units consisting of memory 12 and selection 10 devices.

In operation of the memory, when the buried drain/N+ junction 24 is grounded and a suitable potential is applied to the control gate 30, electrons are tunneled from the buried drain 24 to the floating gate 16, and the add-on floating gate 22 through the tunnel dielectric 26. When the control gate 30 is grounded and a suitable potential is applied to the buried drain 24, the electrons are tunneled in the reverse direction from the add-on floating gate 22 to the buried drain 24 through tunnel dielectric 26. If there are excess electrons at the floating gate 16 and the add-on floating gate 22 of the memory device 12, the positive voltage required at the control gate 30 to conduct current through the memory device 12 of the EEPROM is increased. If there is a deficit of electrons at the floating gate 16 and the add-on floating gate 22, the positive voltage required at the control gate 30 to conduct current through the memory device 12 is reduced. Therefore, whether there is current or no current conducting through the memory device 12 of the EEPROM, at a given voltage at the control gate 30 represents either a 1 or 0 stored in the memory device 12 of the EEPROM.

FIG. 1A shows how the EEPROMs are connected into a memory array. The diffusion line 48 is the common source line of the EEPROM for two adjacent columns. The control gate 30 is the common control gate line for all EEPROMs in one row, and the common gate line 50 is the gate of all selection devices in one row. The metal bit line 36 connects the drains of all selection devices in a single column through the contact 38. The EEPROMs in the memory array are preferably arranged in mirror image pairs as shown in FIGS. 1A and 1B.

The novel method steps of the present invention will now be described. In the fabrication of an EEPROM, processing occurs in steps. The results of the process of each step must be protected from damage by the operations of subsequent processing steps. The present invention provides a method of protecting the tunnel dielectric 26 and oxide 56 areas from damage while the add-on gates 22 and 58 are being fabricated. For convenience of explanation, an N-channel EEPROM array will be used as an example and P-type single crystal silicon will be used as the starting substrate 14.

Figure 2A:
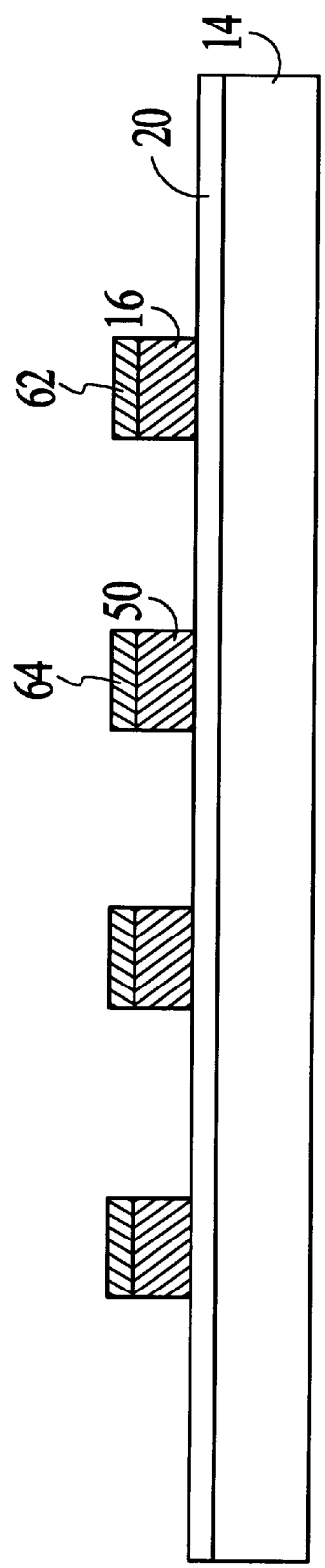
FIG. 2A is a side view illustrating the formation of the poly 1 floating gate and selection device gate and overlying nitride layers.
Figure 2B:
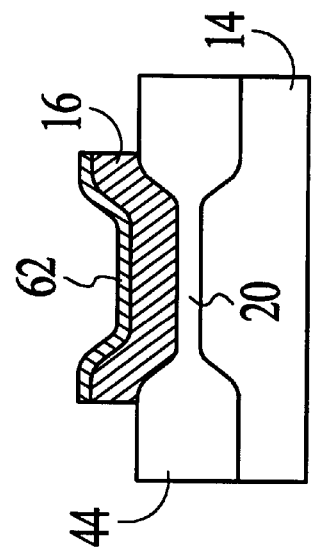
FIG. 2B is a side view perpendicular to the view of FIG. 2A.

The fabrication process includes the conventional fabrication step for an N-channel EEPROM wherein a CVD nitride thin film is deposited on initial oxide grown on the P-type substrate. Then the photoresist pattern of the active area is formed on top of the nitride film, and the nitride outside of the photoresist pattern is etched off. P-type impurity boron is then implanted in the area outside of the photoresist pattern to raise the substrate doping outside of the active areas. This is done to raise the threshold voltage of the parasitic field devices to form better isolation between the active areas. The photoresist patterns are stripped off after the boron implant, and the thick field oxide 44 is grown outside of the active area. During the field oxidation, the active areas 60 and 48 remain protected by a nitride pattern and no oxide is grown. After the field oxide 44 is grown, the nitride and the initial oxide underneath the nitride in the active areas 60 and 48 are stripped off to expose the substrate in the active area only. Then a high quality gate oxide 20 of 200 Å to 1000 Å is grown in the active areas 60 and 48, and photoresist patterns are formed to expose the EEPROM areas for a 3E11 to $3E12/cm^2$ dose of boron implantation. After the photoresist patterns are stripped off, the first layer of polysilicon is deposited and doped, forming the floating gate 16 and gate 50. A Nitride layer is then deposited on the first layer of polysilicon 16 and 50. The photoresist patterns are formed to retain the floating gate 16 with the Nitride 62 and the gate 50 of the selection device with the Nitride 64, and remove the polysilicon from the area outside of the photoresist patterns. After the photoresist patterns are stripped off, the cross-sections along AA and BB are shown in FIG. 2A and FIG. 2B.

Referring to FIG. 3 of the drawing, a buried N+ mask 66 is then formed over the structure of FIG. 2, leaving windows 68 exposed. N-type buried N+ 70 is then applied at a dose level from $10^{13}$ to $5\times10^{14}$ $ion/cm^2$ for implantation of the buried N+ junction areas 24. The portions of gate oxide 20 exposed by windows 68 are then etched off. The photoresist buried N+ mask 66 is then stripped. The resulting structure is illustrated in FIG. 4 showing the implanted areas 24 and the areas 72 where the gate oxide 20 has been etched off. The wafer is then cleaned, and a high quality first thin oxide/tunnel dielectric film 74 is grown (FIG. 5) on the sidewalls of the polystructures 16 and 50 and over the areas 24 forming the tunnel dielectric film 26. Layers 62 and 64 could be nitride or oxide. When one grows oxide, oxide will grow in all areas except under or over nitride.

Figure 6:
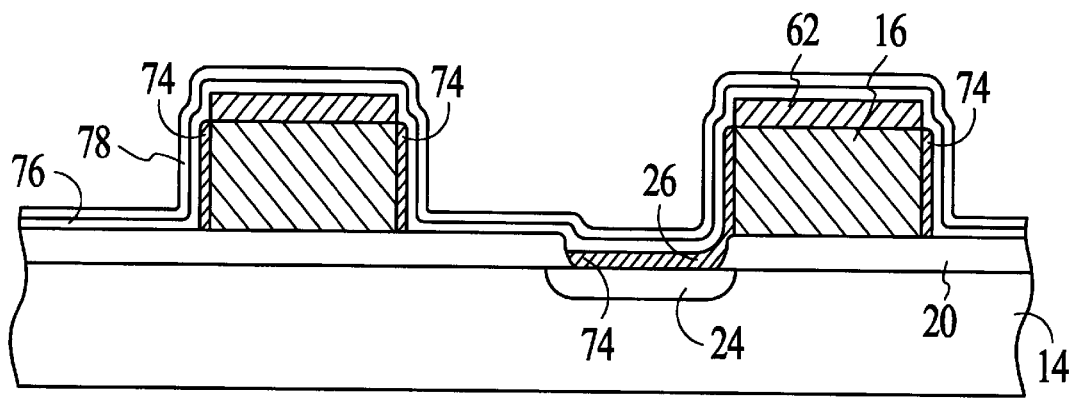
FIG. 6 illustrates the thin polysilicon layer deposition and the thin oxide layer grown on the thin polysilicon layer on the wafers.

At this stage, the first thin oxide/tunnel dielectric film 26 regions are susceptible to contamination. In order to protect them during subsequent processing steps, a thin layer 76 of polysilicon, having a thickness in the approximate range of 100 Å to 1500 Å is deposited (FIG. 6). A thin second oxide layer 78 is then grown over the thin polysilicon layer 76.

Figure 7:
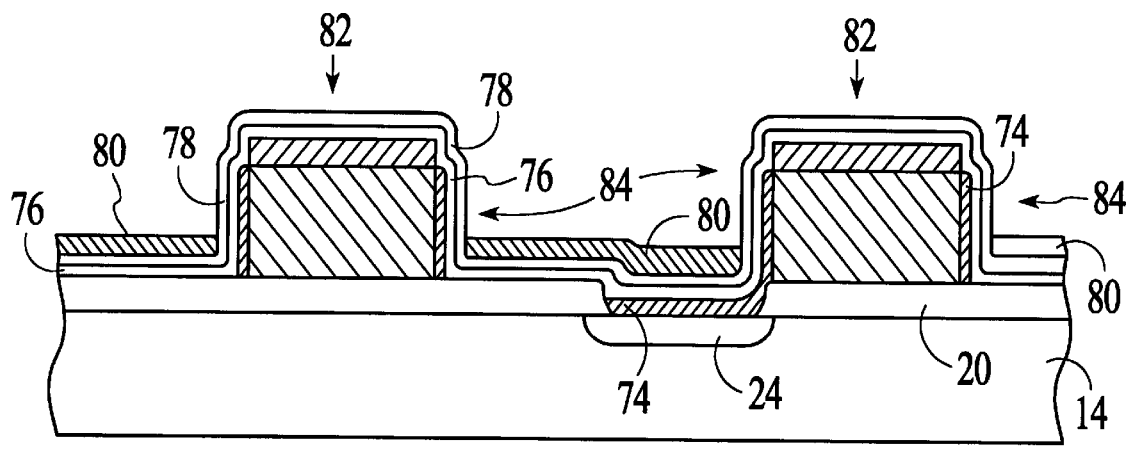
FIG. 7 shows thin photoresist coated and etched back to retain photoresist on the bottom surfaces including the N+ junction.
Figure 8:
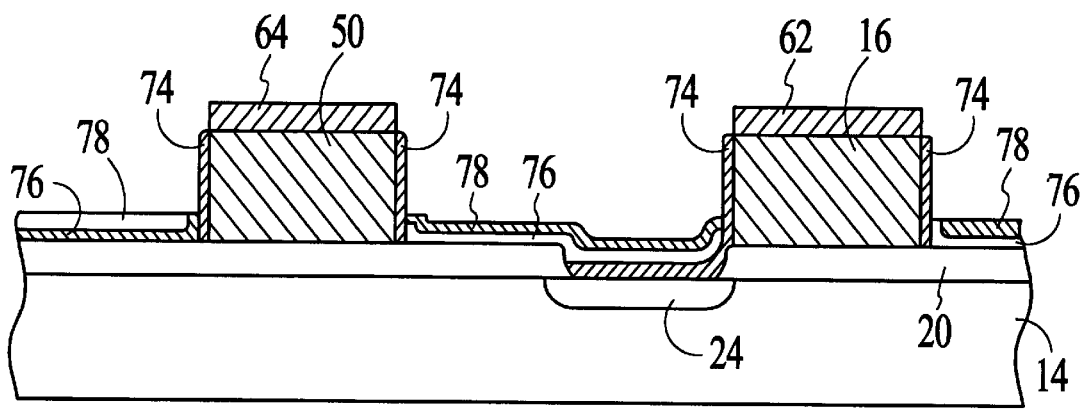
FIG. 8 shows the removal of the second thin oxide at the sidewalls and the top surface of the poly 1 floating gate, and then the thin photoresist, and the thin polysilicon layer from the sidewalls and tops of the gate structures.
Figure 9:
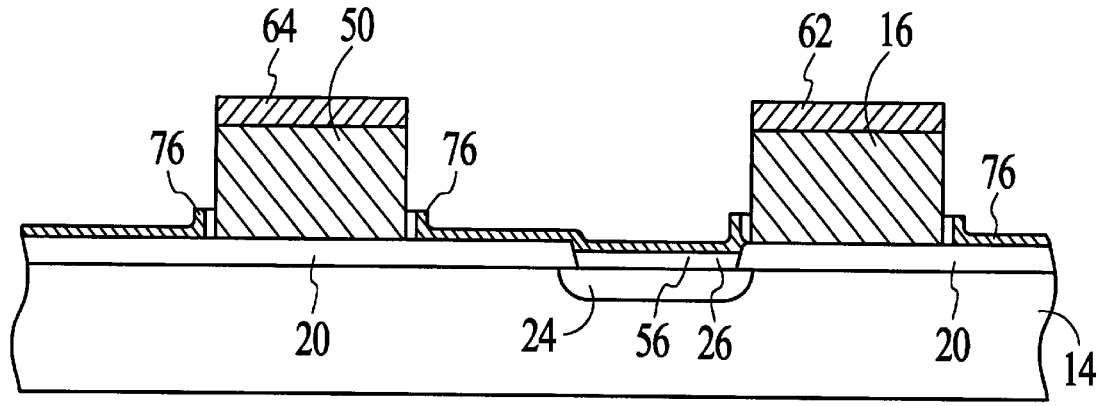
FIG. 9 shows the first thin oxide layer completely removed from the sidewall of the poly 1 floating gate except over the tunnel dielectric area under the thin polysilicon layer.
Figure 10:
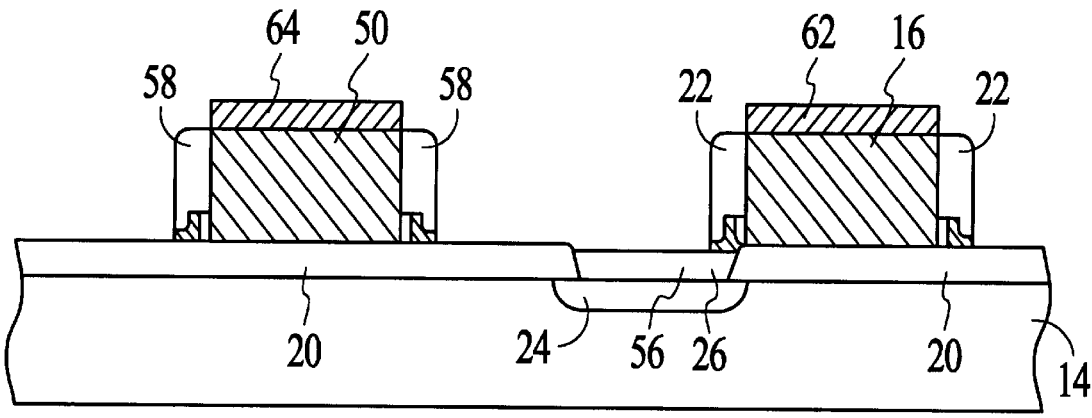
FIG. 10 shows the add-on gates formed to the sidewalls of the floating gate and selection device gate.

Referring now to FIG. 7, in the next processing step a very thin layer of photoresist 80 is spin-coated on the wafer, and partially removed by plasma ashing on the tops 82 and sidewalls 84. The wafer in the condition of FIG. 7 is then etched to remove the portions of the second thin oxide 78 unprotected by resist 80, and then the photoresist 80 is removed. Then the thin polysilicon 76 unprotected by oxide 78 is removed. This result is illustrated in FIG. 8. The first thin oxide layer 74 on the sidewalls of the floating gate 16 and gate 50, and the second thin oxide layer 78 on the thin polysilicon 76 on the tunnel dielectric 26 region are then removed. The remaining polysilicon layer 76 provides protection to the critical tunnel dielectric and oxide areas 56, 26. The wafer is then cleaned, and it appears as shown in FIG. 9. The final step in the method of the present invention is to deposit and etch back anisotropically a polysilicon layer in a thickness of from 500 Å to 3000 Å to form the add-on floating gate 58 and the add-on gate 22 at the sidewalls of polysilicon gate structures 50 and 16, as shown in FIG. 10.

The detailed method steps of the present invention will now be described in further detail in reference to FIGS. 11–24 of the drawing.

Figure 11:
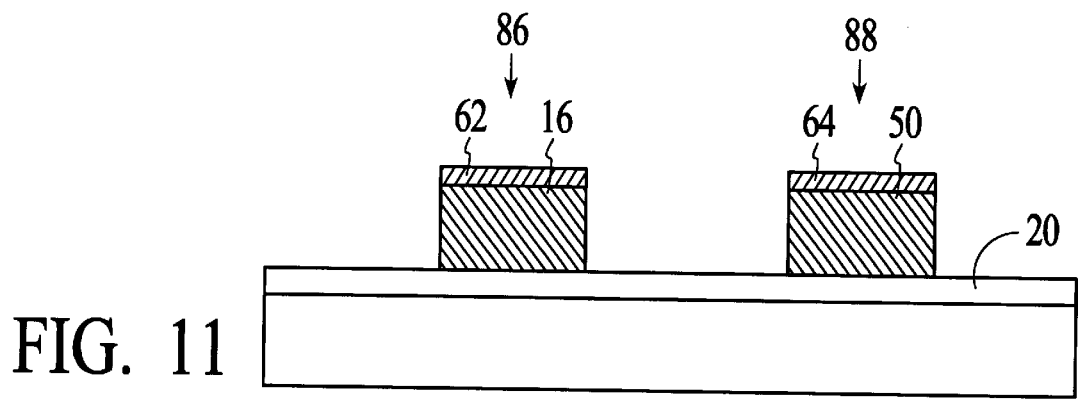
FIG. 11 illustrates memory cell poly 1 floating gate and a selection cell gate structure.

FIG. 11 is a functional duplication of FIG. 2A except showing only one EEPROM unit including one memory cell poly 1 floating gate structure 86 and the corresponding gate structure 88. The gate structures 86, 88 include polysilicon layers 16, 50 and nitride layers 62, 64. The polysilicon layers 16, 50 are formed on the gate oxide layer 20 that is formed on the substrate 14.

Figure 12:
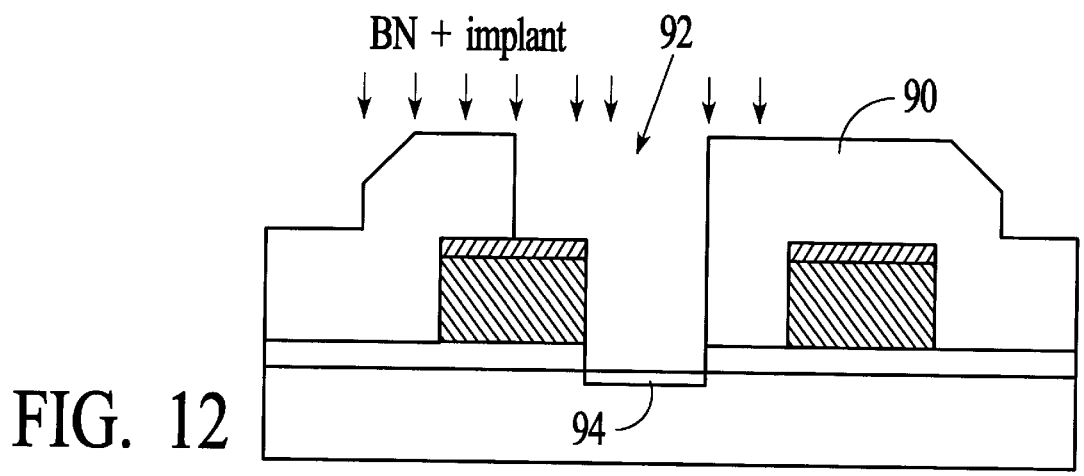
FIG. 12 shows application of a buried N+ photoresist mask, and ion implantation of N-type to form buried N+ junctions in the P-substrate.

FIG. 12 shows the application of a photoresist mask 90 for selecting a window 92 for application of an oxide etch to remove the gate oxide 20 in the area of the window, and then to apply a buried N+ implant dose of $10^{13}$ to $5 \times 10^{14}/cm^2$ in the window to form a buried N+ junction area 94.

Figure 13:
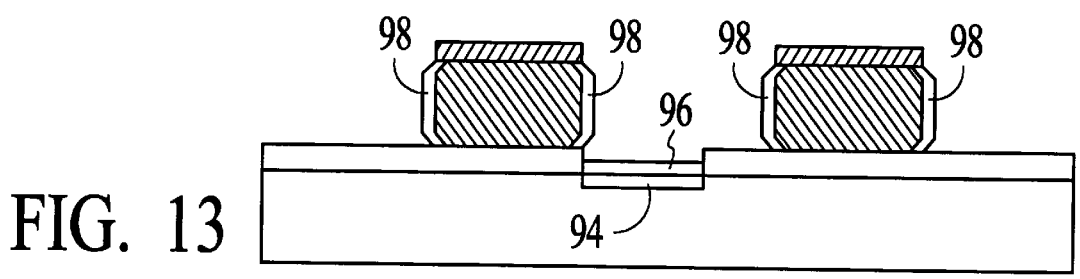
FIG. 13 shows the result of removing resist, and forming a first thin oxide layer.

FIG. 13 shows the result of the next step of stripping off the resist 90 and then forming a tunnel dielectric and first thin oxide/tunnel oxide area 96 over the buried N+ junction 94, and forming a thin oxide 98 on the sidewalls of the polysilicon layers 16 and 50.

FIG. 14 shows the result of the next step of the deposition of a thin polysilicon layer 100, and FIG. 15 shows the result of the subsequent step of growing a second thin oxide layer 102 over the polysilicon layer 100.

FIG. 16 illustrates the application of a thin negative resist coating 103 and exposing it to light. FIG. 17 shows the result after development and a short resist etch, leaving the thin oxide 102 on sidewall areas 104 exposed/uncovered by resist 103.

FIG. 18 shows the result after a buffered oxide etch to remove the exposed second thin oxide layer 102 on the sidewalls 104.

FIG. 19 shows the result of the next step of removing the negative resist 103.

FIG. 20 shows the result of the next step of etching away the exposed portion of polysilicon layer 100 on the sidewall areas 104.

FIG. 21 illustrates removing the remainder of the second thin oxide layer 102, and the first thin oxide layer 98 on the side wall of poly layer 16 and 50, leaving the polysilicon layer 100 exposed.

FIG. 22 illustrates the result of the next step of deposition of a second polysilicon layer 106, and doping the layer 106 with an N type impurity.

FIG. 23 shows the result of a polysilicon anisotropic etch that removes the second polysilicon layer 106 except on the sidewalls of the gate structures 16 and 50 and removes the remainder of the first polysilicon layer 100 except in the areas 108 adjacent to gate structures 16 and 50 and under the second polysilicon layer 106 portion forming an add-on gate 112 to the selection device 88 and add-on gate 110 to the memory cell device 86.

FIG. 24 shows the result of the oxidation to grow back the oxide 113 on the N+ junction 94, and to strip back the nitride layers 62 and 64 on top of the polysilicon gates 16 and 50, and for formation of interpoly dielectric by growing oxide layer 114, depositing nitride layer 116 on top of the oxide layer 114, and the oxidation to form oxide layer 118 on the nitride layer 116.

FIG. 25 shows the result of the application of a polysilicon layer 120, and application of a photomask and etch back of polysilicon layer 120 and layers 116 and 118 outside of the photomask pattern, retaining only the polysilicon layer 120 pattern on top of the memory cell 16, completing the formation of a memory cell 122 and selection gate 124, similar to corresponding respective memory cell 12 and selection gate 10 in FIG. 1A, less the CVD oxide layer 40 and metalization layer 36, the processing of which will be understood by those skilled in the art.

Although the present invention has been described above in terms of a specific embodiment, it is anticipated that alterations and modifications thereof will no doubt become apparent to those skilled in the art. For example, the technique of forming the tunnel dielectric area with the protection against contamination, has been described above for the case of using the technique to form the tunnel dielectric area immediately after forming the floating gate structure using poly silicon layer #1, and before the formation of the control gate structure using poly silicon layer #2. The same technique can also be applied to the case of forming the control gate using poly silicon layer #2, then forming the floating gate structure using the poly silicon layer #1 by the stack gate self align etching technique, and then immediately forming the tunnel dielectric area using the same technique described in this invention. It is therefore intended that the following claims be interpreted as covering all such alternations and modifications as fall within the true spirit and scope of the invention.

It is claimed that:

1. A method of processing in semiconductor manufacture comprising:
   (a) first processing of a wafer to form a first result, said first processing including
      (i) depositing a gate oxide layer over a substrate of said wafer;
      (ii) forming a polysilicon area on said gate oxide layer to form a floating gate having a sidewall;
      (iii) etching through said gate oxide layer in a window area in proximity with said floating gate;
      (iv) implanting said window area with ions to form a junction area:
      (v) forming a tunnel dielectric and first oxide layer over said junction area wherein said tunnel dielectric and first oxide layer is said first result; and
      (vi) forming an oxide on said sidewall; and (b) depositing a polysilicon layer over said first result for the purpose of protecting said first result from subsequent processing performed in said semiconductor manufacture.

2. A method as recited in claim 1 further comprising:

depositing a polysilicon layer to cover said wafer, including said oxide on said sidewall and said tunnel dielectric area.

3. A method as recited in claim 2 further comprising growing a second oxide layer over said polysilicon layer.

4. A method as recited in claim 3 further comprising applying photoresist to said wafer except on said sidewall.

5. A method as recited in claim 4 further comprising etching exposed said second oxide layer from said sidewall.

6. A method as recited in claim 5 further comprising (a) removing said photoresist; and (b) etching to remove exposed said polysilicon layer on said sidewall.

7. A method as recited in claim 6 further comprising:

removing a remainder of said second oxide layer.

8. A method as recited in claim 7 further comprising forming an add-on floating gate to said sidewall.

9. A method as recited in claim 8 wherein said forming an add-on floating gate includes forming a second polysilicon layer and doping said second polysilicon layer with an N type impurity.

10. A method as recited in claim 9 wherein said forming an add-on floating gate further includes performing an anisotropic etch to remove said second polysilicon layer except on said sidewall, and to remove a remainder of said first polysilicon layer except in said tunnel dielectric area in need of protection and under said second polysilicon layer on said sidewall.

11. A method as recited in claim 10 further comprising:

(a) growing an oxide layer over a portion of said tunnel dielectric area uncovered by said first and second polysilicon layers;

(b) forming an interpoly dielectric on said floating gate and add-on gate; and (c) forming a polysilicon layer over said interpoly dielectric.

12. A method of protecting a tunnel dielectric and oxide area on a wafer during fabrication of an EEPROM comprising:

(a) depositing a first polysilicon layer on a wafer, said wafer having a gate structure and said gate structure having a sidewall, upon which is deposited a first oxide layer and said wafer including a tunnel dielectric and oxide area;

(b) growing a second oxide layer over said first polysilicon layer;

(c) applying a photoresist on said second oxide layer except on said sidewall of said gate structure;

(d) etching to remove said second oxide layer on said sidewall;

(e) removing the photoresist;

(f) etching to remove exposed portions of said first polysilicon layer on said sidewall;

(g) removing said second oxide layer leaving said first polysilicon layer exposed;

(h) depositing a second polysilicon layer and doping said second polysilicon layer with an N type impurity;

(i) etching said second polysilicon layer except on said sidewall and etching said first polysilicon layer except over said tunnel dielectric and oxide area in need of said protection; and (j) performing subsequent processing steps to form said EEPROM.

\* \* \* \* \*